United States Patent [19]

Saito

[11] Patent Number: 5,112,529

[45] Date of Patent: May 12, 1992

[54] CONDUCTIVE MATERIAL AND PROCESS FOR PRODUCING THE SAME

[75] Inventor: Kazuo Saito, Tokyo, Japan

[73] Assignee: Nisshinbo Industries, Inc., Tokyo, Japan

[21] Appl. No.: 577,710

[22] Filed: Sep. 4, 1990

[30] Foreign Application Priority Data

Sep. 5, 1989 [JP] Japan .................................. 1-229860

[51] Int. Cl.$^5$ .......................... H01B 1/00; H01B 1/06; C08F 6/00

[52] U.S. Cl. .................................... 252/500; 252/512; 252/518; 524/80; 524/404; 524/408; 524/415; 524/418; 524/421; 524/422; 524/429; 524/439; 528/487; 528/488; 528/490; 528/481; 528/502; 528/503

[58] Field of Search .......................... 252/500, 512, 518; 524/401, 439, 80, 414, 415, 422, 429, 421, 418, 404; 528/487, 481, 488, 490, 502, 503

[56] References Cited

U.S. PATENT DOCUMENTS

| | | | |
|---|---|---|---|
| 4,556,507 | 12/1985 | Tomibe et al. | 252/519 |
| 4,556,508 | 12/1985 | Tomibe et al. | 252/518 |
| 4,778,625 | 10/1988 | Matsumura et al. | 252/512 |
| 4,832,860 | 5/1989 | Cotts et al. | 252/500 |
| 4,832,869 | 5/1989 | Cotts | 252/500 |

*Primary Examiner*—Josephine Barr
*Attorney, Agent, or Firm*—Armstrong, Nikaido, Marmelstein, Kubovcik & Murray

[57] ABSTRACT

The present invention relates to a conductive material and a process for producing said conductive material. More particularly, the present invention relates to a conductive material comprising (a) a substrate obtained from a polycarbodiimide resin and (b) a dopant, which is superior in oxidation resistance, mechanical strengths and flexibility, and useful as a material for electronic field, as well as to a process for producing said conductive material.

10 Claims, No Drawings

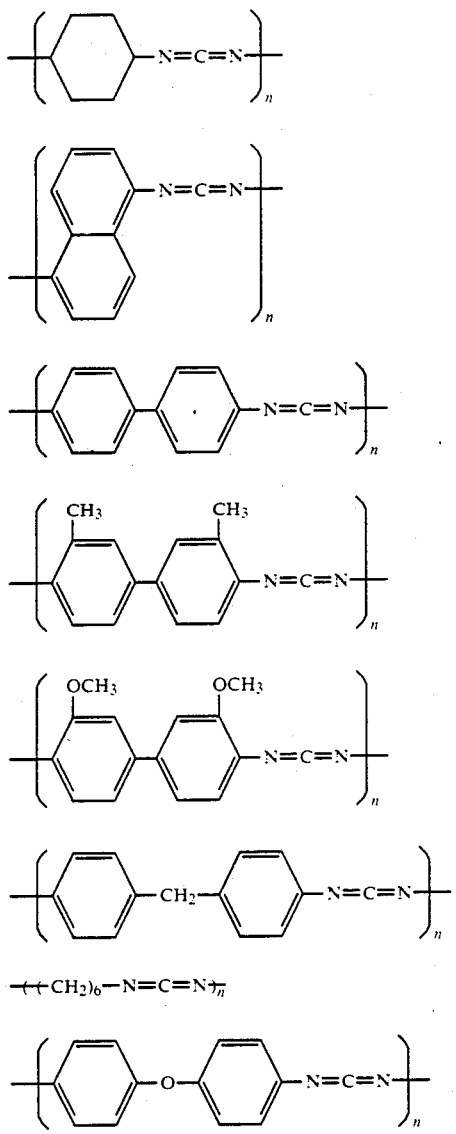

In the above formulas, n is the degree of polymerization and is in the range of 10-10,000, preferably in the range of 50-5,000.

Incidentally, the terminal(s) of the polycarbodiimide resin may be blocked with a monoisocyanate or the like, and the polycarbodiimide resin described above can be obtained in a solution form, or as a powder precipitated from the solution.

Next, the thus obtained polycarbodiimide resin is molded into a desired shape such as a film, a sheet, a fiber or a composite thereof. The molding can be effected, for example, by casting a solution containing a polycarbodiimide resin, obtained by polymerization reaction, or a solution obtained by dissolving a polycarbodiimide resin powder in a solvent, on a flat and smooth glass plate or the like and then removing the solvent. As the solvent, there can be used tetrachloroethnylene, trichloroethylene, tetrahydrofuran, dioxane, monochlorobenzene, dichlorobenzene, dimethylformamide, N-methyl-2-pyrrolidone, dimethylacetamide, dimethylsulfoxide, etc.

The molding may also be effected by subjecting a polycarbodiimide resin powder to compression molding, roll molding, injection molding, transfer molding or the like. By the above solution or powder molding, there can be easily obtained a shaped article having a thickness of about 0.1-3 mm.

The thus obtained polycarbodiimide resin is then heat-treated to convert to an insoluble and infusible substrate. This heat treatment is effected at 350-900° C., preferably in vacuum or n an insert gas atmosphere.

Lastly, the insoluble and infusible substrate is doped with a dopant to obtain a conductive material of the present invention. The dopant can be an electron-donating dopant or an electron-accepting dopant.

The electron-donating dopant can be illustrated by metals of the group 1A of the periodic tale including lithium, sodium, potassium, rubidium and cesium. The electron-accepting dopant can be illustrated by halogens (fluorine, chlorine, bromine, iodine), halides (e.g. AsF5, PF5, BF5, BCl3, BBr3), oxides of nonmetallic elements (e.g. SO3, N2O3) and negative ions derived from inorganic acids such as H2SO4, HNO3, HClO4 or the like.

The present invention is described in more detail by way of Examples.

EXAMPLES

Preparation of Polycarbodiimide Film A 54 g of a mixture consisting of 2,4-tolylene diisocyanate and 2,6-tolylene diisocyanate (80/20) was subjected to a reaction in the presence of 1.12 g of a carbodiimidization catalyst (1-phenyl-3-methylphophorene oxide) in 500 ml of tetrachloroethylene at 120° C. for 4 hours, to obtain a polycarbodiimide solution. Using this solution, there was prepared a polycarbodiimide film of 20 μm in thickness by a dry method.

The film was heated from room temperature to desired temperatures at a temperature elevation rate of 5° C./min in a nitrogen current to obtain insoluble and infusible substrates.

The heating conditions of the film and the conductivities of the heated films (substrates) are shown below.

| Symbol of substrate | Heating temperature | Conductivity |
|---|---|---|
| A-1 | 150° C. | $10^{-16}$ |
| A-2 | 350° C. | $1.0 \times 10^{-14}$ |
| A-3 | 500° C. | $1.0 \times 10^{-11}$ |
| A-4 | 700° C. | $2.8 \times 10^{0}$ |
| A-5 | 900° C. | $9.0 \times 10^{1}$ |
| A-6 | 1,200° C. | $2.0 \times 10^{2}$ |

In the above, the unit of conductivity is $\Omega^{-1} cm^{-1}$, and conductivity was measured by the four-probe method.

The substrates were then doped as follows.

EXAMPLES 1-4

Comparative Examples 1-2

Each of the substrates obtained in the above preparation A was placed in a vacuum line; the vacuum line was subjected to a vacuum of $10^{-2}$ Torr or less; iodine gas was introduced into the vacuum line to effect doping for 3 minutes at room temperature.

EXAMPLES 5-7

The substrates A-2 to A-4 obtained in the preparation A above were placed in a vacuum line; the vacuum line was subjected to a vacuum of $10^{-2}$ Torr or less; SO3

CONDUCTIVE MATERIAL AND PROCESS FOR PRODUCING THE SAME

BACKGROUND OF THE INVENTION

1. Field of the Invention

The present invention relates to a conductive material and a process for producing said conductive material. More particularly, the present invention relates to a conductive material comprising (a) a substrate obtained from a polycarbodiimide resin and (b) a dopant, which is superior in oxidation resistance, mechanical strengths and flexibility, and useful as a material for electronic field, as well as to a process for producing said conductive material.

2. Prior Art

In recent years, there have been movements of utilizing properties of polymer materials in a variety of application fields. These movements include the development of conductive polymer materials having a high conductivity.

Conductive polymer materials have heretofore been produced by doping a conjugated polymer such as polyacetylene, polyparaphenylene or the like to increase the conductivity, or by heating a polymer material to 1,000-3,000° C. to carbonize it.

These conventional conductive materials, however, have drawbacks.

That is, the conductive polymer materials produced by the former process, when allowed to stand in air after doping, are oxidized by the oxygen in the air and thus unstable; the conductive polymer materials produced by the latter process lack in flexibility.

SUMMARY OF THE INVENTION

The present invention has been made in order to eliminate the drawbacks of the prior art and to provide a conductive material superior in oxidation resistance, mechanical strength and flexibility, and useful as a material for electronics field, as well as a process for producing the conductive material.

According to the present invention, there are provided a conductive material comprising (a) an insoluble and infusible substrate obtained by heat-treating a polycarbodiimide resin and (b) an electron-donating dopant or an electron-accepting dopant, and a process for producing a conductive material, which comprises heat-treating a polycarbodiimide resin to obtain an insoluble and infusible substrate and doping the substrate with an electron-donating dopant or an electron-accepting dopant.

DESCRIPTION OF THE PREFERRED EMBODIMENTS

The present invention is described in detail below.

The polycarbodiimide resin used in the present invention can be a known polycarbodiimide resin or a polycarbodiimide resin which can be produced in the same manner as that for a known polycarbodiimide resin [reference is made to U.S. Pat. No. 2,941,966; Japanese Patent Publication No. 33297/1972; J. Org. Chem., 28, 2069-2075 (1963); Chemical Review, 1981, Vol. 81, No. 4,619-621; etc.]. It can be easily produced by subjecting an organic diisocyanate to a condensation reaction wherein the elimination of carbon dioxide takes place.

The organic diisocyanate used in the production of a polycarbodiimide resin can be any of aliphatic type, alicyclic type, aromatic type, aromatic-aliphatic type, etc. They can be used alone or in combination of two or more (the latter case gives a copolymer).

The polycarbodiimide resin used in the process of the present invention includes a homopolymer or a copolymer each having at least one repeating unit represented by the formula $$-R-R=C=N- \tag{I}$$

wherein R represents an organic diisocyanate residue.

As the R (organic diisocyanate residue) in the formula (I), there is particularly preferred an aromatic diisocyanate residue. In the present specification, the "organic diisocyanate residue" refers to a portion remaining after subtracting two isocyanate (NCO) groups from an organic diisocyanate molecule.

The polycarbodiimidization catalyst has no particular restriction and can be illustrated by conventionally used phosphorene oxides such as 1-phenyl-2-phosphorene-1-oxide, 3-methyl-2-phosphorene-1-oxide, 1-ethly-3-methyl-2-phosphorene-1-oxide, 1-ethyl-2-phosphorene-1-oxide and 3-phosphorene isomers thereof or the like.

Specific examples of the polycarbodiimide resin include the following.

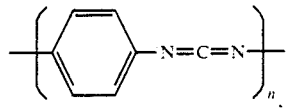

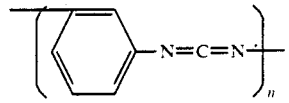

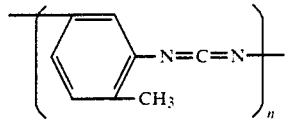

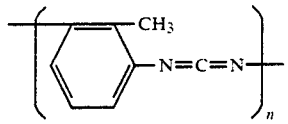

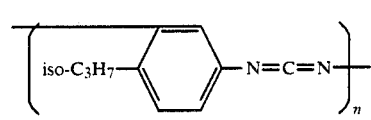

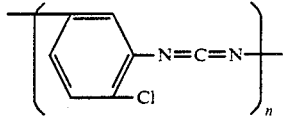

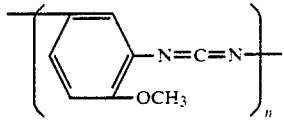

gas was introduced into the vacuum line to effect doping for 30 minutes at room temperature.

EXAMPLES 8-10

The substrates A-2 to A-4 obtained in the preparation A above were placed in a vacuum line; the vacuum line was subjected to a vacuum of $10^{-2}$ Torr or less; AsF56 gas was introduced into the vacuum line to effect doping for 45 minutes at room temperature.

EXAMPLES 11-14

Using dehydrated tetrahydrofuran, naphthalene and metallic sodium, there was prepared a tetrahydrofuran solution containing sodium naphthalate.

The substrates A-2 to A-5 obtained in the preparation A above were immersed in the above solution to effect doping at room temperature for 24 hours. The doped substrates were washed with tetrahydrofuran and dried at room temperature under vacuum.

The results of the above doping are shown in Table 1.

As is clear from Table 1, the substrates A-2 to A-5, when doped, showed improved conductivities. They also showed sufficient flexibility, and good conductivity stability at room temperature.

In contrast, the substrates A-1 and A-6, when doped, showed no change in conductivity or a decease in conductivity.

TABLE 1

|  | Substrate (heated film) | Conductivity (before doping) | Conductivity (after doping) |
| --- | --- | --- | --- |
| Comparative Example 1 | A-1 | $10^{-16}$ | $10^{-16}$ |
| Example 1 | A-2 | $1.0 \times 10^{-14}$ | $2.0 \times 10^{-6}$ |
| Example 2 | A-3 | $1.0 \times 10^{-11}$ | $1.0 \times 10^{-5}$ |
| Example 3 | A-4 | $2.8 \times 10^{0}$ | $2.0 \times 10^{1}$ |
| Example 4 | A-5 | $9.0 \times 10^{1}$ | $2.3 \times 10^{2}$ |
| Comparative Example 2 | A-6 | $2.0 \times 10^{2}$ | $5.0 \times 10^{1}$ |
| Example 5 | A-2 | $1.0 \times 10^{-14}$ | $5.0 \times 10^{-6}$ |
| Example 6 | A-3 | $1.0 \times 10^{-11}$ | $3.2 \times 10^{-5}$ |
| Example 7 | A-4 | $2.8 \times 10^{0}$ | $1.0 \times 10^{1}$ |
| Example 8 | A-2 | $1.0 \times 10^{-14}$ | $3.0 \times 10^{-5}$ |
| Example 9 | A-3 | $1.0 \times 10^{-11}$ | $2.4 \times 10^{-4}$ |
| Example 10 | A-4 | $2.8 \times 10^{0}$ | $9.0 \times 10^{1}$ |
| Example 11 | A-2 | $1.0 \times 10^{-14}$ | $5.0 \times 10^{-5}$ |
| Example 12 | A-3 | $1.0 \times 10^{-11}$ | $3.5 \times 10^{-5}$ |
| Example 13 | A-4 | $2.8 \times 10^{0}$ | $2.0 \times 10^{1}$ |
| Example 14 | A-5 | $9.0 \times 10^{1}$ | $2.0 \times 10^{2}$ |

In the above, the unit of conductivity is $\Omega^{-1}.cm^{-1}$.

Preparation of Polycarbodiimide Film B 50 g of methylene diphenyldiisocyanate was subjected to a reaction in the presence of 0.13 g of a carbodiimmidization catalyst (1-phenyl-3-methylphosphorene oxide) in 820 ml of tetrachloroethylene at 120° C. for 6 hours. The resulting solution was cooled to room temperature, whereby a polycarbodiimide was precipitated. The precipitate was collected by filtration and dried at 100° C. for 2 hours to obtain a polycarbodiimide powder.

The powder was subjected to press molding at 180° C. at 80 kg/cm² to obtain a polycarbodiimide film of 20 μm in thickness. The film was heated in the same manner as in the preparation A above, to obtain insoluble and infusible substrates.

The heating conditions of the film and the conductivities of the heated films (substrates) are shown below.

| Symbol of substrate | Heating temperature | Conductivity |
| --- | --- | --- |
| B-1 | 350° C. | $2.1 \times 10^{-19}$ |
| B-2 | 500° C. | $1.8 \times 10^{-11}$ |
| B-3 | 700° C. | $3.5 \times 10^{0}$ |
| B-4 | 900° C. | $8.9 \times 10^{1}$ |

In the above, the unit of conductivity is $\Omega^{-1}.cm^{-1}$.

Preparation of Polycarbodiimide Film C

The powder obtained in the preparation B above was subjected to melt spinning to obtain a polycarbodiimide fiber of 10 μm in diameter and 10 mm in length. The fiber was layered and subjected to press molding at 150° C. at 100 kg/cm² to obtain a sheet-like material. And the sheet-like material was heated in the same manner as in the preparation A above, to obtain insoluble and infusible substrates.

The heating conditions of the fiber and the conductivities of the heated fibers (substrates) are shown below.

| Symbol of substrate | Heating temperature | Conductivity |
| --- | --- | --- |
| C-1 | 500° C. | $1.8 \times 10^{-11}$ |
| C-2 | 700° C. | $3.4 \times 10^{0}$ |
| C-3 | 900° C. | $8.8 \times 10^{1}$ |

In the above, the unit of conductivity is $\Omega^{-1}.cm^{-1}$.

EXAMPLES 15-18 and 19-21

The substrates B-1 to B-4 and the substrates C-1 to C-3 were doped with iodine in the same manner as in Examples 1-4 and Comparative Examples 1-2.

The results are shown in Table 2.

TABLE 2

|  | Substrate (heated film or fiber) | Conductivity (before doping) | Conductivity (after doping) |
| --- | --- | --- | --- |
| Example 15 | B-1 | $2.7 \times 10^{-14}$ | $3.2 \times 10^{-6}$ |
| Example 16 | B-2 | $1.8 \times 10^{-11}$ | $2.1 \times 10^{-5}$ |
| Example 17 | B-3 | $3.5 \times 10^{0}$ | $3.1 \times 10^{1}$ |
| Example 18 | B-4 | $8.9 \times 10^{1}$ | $2.0 \times 10^{2}$ |
| Example 19 | C-1 | $1.8 \times 10^{-11}$ | $2.0 \times 10^{-5}$ |
| Example 20 | C-2 | $3.4 \times 10^{0}$ | $3.0 \times 10^{1}$ |
| Example 21 | C-3 | $8.8 \times 10^{1}$ | $1.9 \times 10^{2}$ |

In the above, the unit of conductivity is $\Omega^{-1}.cm^{-1}$.

As appreciated from the above description, the conductive material of the present invention is free from the drawbacks of the conventional conductive polymer materials, for example, the high carbonization temperature of 1,000° C. or higher, the instability in air and the lack in flexibility.

Further, the conductive material of the present invention can be produced economically.

What is claimed is:

1. A conductive material comprising (a) an insoluble and infusible substrate obtained by heat-treating a polycarbodiimide resin which is a homopolymer or copolymer comprising at least one repeating unit represented by the formula $$-R-N=C=N-$$

where R is an aromatic diisocyanate residue, at a temperature of 350-900° C. in vacuum or in an inert gas atmosphere to obtain said substrate and (b) (i) an electron-donating dopant selected from metals of group 1A of the periodic table or (ii) an electron-accepting dopant selected from the group consisting of halogens, halides, $SO_3$, $N_2O_3$, $H_2SO_4$, $HNO_3$, and $HClO_4$, the electron-donating dopant or electron-accepting dopant being present in an amount sufficient to increase the conductivity of said substrate.

2. A conductive material according to claim 1, wherein the polycarbodiimide resin is a film, a sheet, a fiber or a composite thereof.

3. A process for producing a conductive material, which comprises heat-treating a polycarbodiimide resin which is a homopolymer or copolymer comprising at least one repeating unit represented by the formula $$-R-N=C=N-$$

where R is an aromatic diisocyanate residue, at a temperature of 350–900° C. in vacuum or in an inert gas atmosphere to obtain an insoluble and infusible substrate and doping the substrate with (i) an electron-donating dopant selected from metals of group 1A of the periodic table or (ii) an electron accepting dopant selected from the group consisting of halogens, halides, $SO_3$, $N_2O_3$, $H_2SO_4$, $HNO_3$, and $HClO_4$, in an amount sufficient to increase the conductivity of said substrate.

4. A process according to claim 3, wherein the polycarbodiimide resin is a film, a sheet, a fiber or a composite thereof.

5. A conductive material according to claim 1, wherein the electron-accepting dopant is selected from the group consisting of lithium, sodium, potassium, rubidium and cesium.

6. A conductive material according to claim 1, wherein the electron-accepting dopant is selected from the group consisting of fluorine, chlorine, bromine and iodine.

7. A conductive material according to claim 1, wherein the electron-accepting dopant is selected from the group consisting of $AsF_5$, $PF_5$, $BCl_3$, $BBr_3$.

8. A process according to claim 3, wherein the electron-accepting dopant is selected from the group consisting of lithium, sodium, potassium, rubidium and cesium.

9. A process according to claim 3, wherein the electron-accepting dopant is selected from the group consisting of fluorine, chlorine, bromine and iodine.

10. A process according to claim 3, wherein the electron-accepting dopant is selected from the group consisting of $AsF_5$, $PF_5$, $BF_5$, $BCl_3$, $BBr_3$.

* * * * *